United States Patent [19]

Stayner et al.

[11] 4,028,143

[45] June 7, 1977

[54] WAX-FLUX COMPOSITION CONTAINING A SUCCINIMIDE SALT OF AN ALKYLARYL SULFONIC ACID FOR SOLDERING

[75] Inventors: Robert A. Stayner, Lafayette; Warren Lowe, El Cerrito, both of Calif.

[73] Assignee: Chevron Research Company, San Francisco, Calif.

[22] Filed: Nov. 3, 1975

[21] Appl. No.: 627,992

Related U.S. Application Data

[62] Division of Ser. No. 537,147, Dec. 30, 1974, Pat. No. 3,954,494.

[52] U.S. Cl. .............................. 148/23; 228/180 R; 228/212; 228/223
[51] Int. Cl.² ........................................ C23K 35/34
[58] Field of Search .............. 228/223, 212, 180 R; 148/23–26; 29/503, 626

[56] References Cited

UNITED STATES PATENTS

| | | | |
|---|---|---|---|
| 2,687,362 | 8/1954 | Rueggeberg | 148/23 |
| 2,898,255 | 8/1959 | Thompson | 148/23 |
| 3,568,295 | 3/1971 | Moran | 29/503 |
| 3,574,934 | 4/1971 | DeRose | 29/626 |
| 3,680,762 | 8/1972 | Kondo | 29/626 |
| 3,780,431 | 12/1973 | Feenem | 29/626 |
| 3,944,123 | 3/1976 | Jacobs | 148/23 |
| 3,966,110 | 6/1976 | Boynton | 228/175 |

*Primary Examiner*—P. D. Rosenberg
*Attorney, Agent, or Firm*—C. J. Tonkin; J. Tedd Brooks

[57] ABSTRACT

Wax-flux compositions for use in low-temperature soldering processes comprise (A) a major amount of a wax and (B) an effective amount to cause fluxing, at or below the soldering temperature of the piece to be soldered, of a wax-soluble product obtained by first reacting an aliphatic hydrocarbon-substituted succinic acid or derivative thereof which is capable of forming carboximide bonds with an alkylene polyamine to form a carboximide and then reacting said carboximide with an alkylaryl sulfonic acid. A process for soldering electrical components to a printed circuit board comprises (A) applying a molten wax-flux composition as described above to the metal pattern side of the board, (B) allowing the wax-flux composition to solidify, (C) trimming the components leads, and (D) soldering the components to the printed circuit board.

6 Claims, No Drawings

WAX-FLUX COMPOSITION CONTAINING A SUCCINIMIDE SALT OF AN ALKYLARYL SULFONIC ACID FOR SOLDERING

This is a division of application Ser. No. 537,147, filed Dec. 30, 1974, and now U.S. Pat. No. 3,954,494.

BACKGROUND OF THE INVENTION

Field of the Invention

This invention relates to low-temperature soldering processes. This invention also relates to wax-flux compositions useful in such low-temperature soldering processes.

A commercially popular labor saving process for assembling electronic components is to install these components on a printed circuit board. After most, if not all, of the components are installed on the circuit board, the components are soldered into place by a process known as wave soldering.

One difficulty with the wave soldering process is that the components have leads which extend 1–2 inches beyond the surface of the printed circuit board. This long length requires a very high standing wave of solder. The standing wave can be forced high enough to solder these long lead components but this has disadvantages. Among them, a large amount of solder is lost in coating all these long leads and large globs of solder form between groups of leads which extend below the board. However, by soldering the printed circuit board prior to lead trimming, the components are fixed in place and can be trimmed by mechanical means rather than being hand trimmed, although hand-trimming, of course, is quite feasible.

The disadvantage of trimming a circuit board after it has been soldered is that critical applications, such as military or space applications require the circuit boards be resoldered subsequent to the trimming. This, of course, greatly increases the expense to the party doing the soldering as well as increases the risk of damage to the components.

An alternative to soldering the long leads is to hand trim them and bend the stubs over against the board before soldering. The bent-over stubs hold the components in place during the soldering operation. Advantages of this method are that only one soldering operation is required and only a low wave of solder need be maintained. The disadvantage is the large amount of hand labor required by this method.

What is needed is an inexpensive method which does not involve solder to fix the components in place on the circuit board while the leads are being trimmed and which does not interfere with the subsequent soldering operation.

Wave soldering also uses a flux to clean the printed circuit board and prepare both the component leads and the printed circuit board foil to receive the solder. In a typical commercial installation, a liquid flux is maintained in a bath which contains fritted aspirators. Aspirating the liquid results in a foam head on the flux tank. The amount of aspiration is controlled so that the foam head just touches the printed circuit boards conveyed above it. A light film of the liquid flux is then deposited on the printed circuit board which subsequently passes over a heater. This preheats the circuit board. The printed circuit board immediately thereafter passes over the standing wave of solder and the soldering process is accomplished.

One disadvantage of using this method of applying the soldering flux to the parts which are to be soldered is that extra equipment is needed. In addition, the flux must be aspirated very carefully and constant attention must be paid to the machinery to see that the flux head remains at the right height. If the flux head is too low, obviously the printed circuit boards will not be properly treated and a poor soldering job will result. If the flux head is too high, the entire circuit board including the components may be coated with flux which requires additional cleaning as well as wastes soldering flux. What is needed is a convenient way to apply the soldering flux to the printed circuit board which does not require special equipment and special attention.

Certain sulfonic acids, notably the alkylaryl sulfonic acids have been suggested as suitable fluxing agents for wax-flux compositions. These acids are conveniently prepared by oleum sulfonation. However, this process yields sulfonic acids containing a certain amount (often up to 2% weight or more) of free sulfuric acid. Sulfonic acid fluxes which contain free sulfuric acid tend to stain phenolic printed circuit boards brown even at room temperature, but particularly so at elevated (e.g., soldering) temperatures.

The present invention not only solves the problem of how to firmly fix the components to the printed circuit board for the lead-trimming operation, but also the problem of how to conveniently apply soldering flux to the printed circuit board all in a single-step operation. The present invention also solves the problem of staining of phenolic printed circuit boards caused by the presence of free sulfuric acid in the sulfonic acids.

SUMMARY OF THE INVENTION

A wax-flux composition for use in low-temperature soldering processes is provided comprising (A) a major amount of a wax and (B) an amount effective to cause fluxing, or at below the soldering temperature of the piece to be soldered, of a wax-soluble succinimide salt of an alkylaryl sulfonic acid. The hardness of the wax at room temperature is chosen to effectively hold the electronic components in place during an automatic lead-trimming operation. The succinimide salt of an alkylaryl sulfonic acid provides fluxing action during the subsequent soldering step thereby obviating the need to separately apply a soldering flux. It is believed that the salt of the sulfonic acid decomposes at or below the soldering temperature to provide sulfonic acid which acts as a flux. However, the salt of the sulfuric acid is not so easily thermally decomposed. Accordingly, the sulfuric acid is not released and therefore does not stain the phenolic board.

DETAILED DESCRIPTION OF THE INVENTION

Wax-flux compositions for use in a low-temperature soldering process are provided comprising: (A) a major amount of a wax having an American Melting Point (AMP determined by ASTM D 127–60) between 40° C and 100° C and (B) an amount effective to cause fluxing, at or below the soldering temperature of the piece to be soldered in said process, of a wax-soluble product obtained by first reacting a $C_{20}$–$C_{400}$ aliphatic hydrocarbon-substituted succinic acid or a derivative thereof which is capable of forming carboximide bonds with a $C_2$–$C_{30}$, $N_2$–$N_{10}$ alkylene polyamine to form a carboxamide and then reacting said carboxamide with a ($C_8$–$C_{30}$ alkyl)aryl sulfonic acid. In a second embodiment of the invention a process is provided for soldering electrical components to a printed circuit board, said board comprising a non-conducting substrate and a pattern of an electrically conductive metal laminated to said substrate, said metal being solderable with a low-melting-point alloy solder, said board having component lead receiving holes through both said substrate and said metal pattern, comprising:

a. applying a molten wax-flux composition described above to the metal pattern side of said board and to said component leads;
b. allowing said wax-flux composition to solidify;
c. trimming said component leads; and
d. soldering said component to said printed circuit board with a low-melting-point alloy solder.

The Wax

Suitable waxes for use in the wax-flux compositions of this invention and in the soldering processes of this invention include any wax or wax blend which is solid at room temperature and has a melting point below the temperature at which the soldering process will be conducted. Preferably the waxes have an AMP of at least 40° C and generally the waxes will have an AMP not greater than 100° C. Preferably the waxes have an AMP between 50° C and 80° C.

Suitable waxes include petroleum-derived waxes such as the well known paraffin waxes. These paraffin waxes are obtained from the processing of crude petroleum and are generally substantially saturated, substantialy straight long-chain aliphatic hydrocarbons. Petroleum waxes suitable for use in this invention have AMP's within the range specified above.

Suitable wax blends for use in this invention include the hot melt coatings which consist of blends of petroleum waxes and polymers, copolymers or resins. Suitable materials which may be blended with the petroleum waxes include polymers of low molecular weight olefins, such as polymers of ethylene, propylene, butylene, isobutylene, and the like. Suitable polymers will have molecular weights from about 1000 to about 1,000,000, more usually from about 1000 to about 50,000. These are average molecular weights and generally a major portion of the molecules of the polymer will have molecular weights close to the average.

Suitable copolymers include copolymers of olefins with olefinic esters such as ethylene-vinyl acetate copolymers. These copolymers are commercially available from E. I. DuPont DeNemours & Company under the trade name ELVAX. Other suitable copolymers include copolyers of different olefins such as the copolymers of propene and butene. Typically such a copolymer will contain from about 15 to about 85 mol percent propene, more usually from about 25 to 75 mol percent propene. Typical copolymer molecular weights will range from about 1000 to about 1,000,000, more usually from about 1000 to about 300,000.

Other suitable wax blends include wax compositions incorporating cellulose esters or cellulose ethers. Suitable cellulose esters include alkyl esters of cellulose wherein the cellulose molecule contains, on the average, 3 alkyl radicals per glucose unit, i.e., the cellulose esters are triesters of cellulose. Typically, the alkyl radicals contain from about 7 to about 16 carbon atoms which include cellulose triheptanoate, cellulose trioctanoate, cellulose tridecanoate, cellulose trilaurate, etc.

Suitable cellulose ethers include the di- and triethers of cellulose wherein the ether radicals are hydrocarbon radicals, preferably alkyl radicals each having from 1 to 18 carbon atoms, with the combined total number of carbon atoms preferably being at least 12. In other words, although each of the hydrocarbon ether radicals on each glucose unit of the cellulose has from 1 to 18 carbon atoms, the total number of carbon atoms preferably is at least 12. In the case of diethers, one of the ether radicals preferably contains at least 8 carbon atoms. Suitable ethers of cellulose include cellulose methyl octyl ether, cellulose ethyl octyl ether, cellulose ethyl decyl ether, cellulose ethyl dodecyl ether, cellulose ethyl tetradecyl ether, cellulose propyl octyl ether, cellulose butyl octyl decyl ether, celulose methyl butyl amyl ether, cellulose tri(butyl) ether, cellulose methyl octyl octadecyl ether, etc.

Typically the cellulose, prior to etherification or esterification, has a molecular weight ranging from about 40,000 to about 500,000. Typically the cellulose esters and cellulose ethers are used in the wax compositions in amounts ranging from about 2 to about 30 percent, preferably from about 10 to about 20 percent by weight.

Suitable waxes for this invention also include waxes obtained from natural sources, such as animal, vegetable or insect sources. Suitable waxes include beeswax, carnuba wax, montan wax, wool wax, and the like.

Another type of wax suitable for use in this invention includes the well known Fischer-Tropsch waxes. Fischer-Tropsch waxes are waxes synthesized by the familiar Fischer-Tropsch process. By this process, coal is burned in the presence of oxygen and steam to produce hydrogen and carbon monoxide, which are then reacted in the presence of catalyst to make the desired hydrocarbon wax. Suitable Fischer-Tropsch waxes for this invention can be obtained under the trade name "Paraflint." These particular Fischer-Tropsch waxes have a high molecular weight, on the average in the range of about 750 to 1000 and generally consist essentially of straight-chained hydrocarbons.

Although the above waxes have been mentioned individually suitable waxes for this invention include mixtures of various proportions of the above-mentioned waxes.

The Fluxing Agent

The wax-flux compositions provided by this invention are useful in the process of this invention include a wax-soluble succinimide salt of an alkylaryl sulfonic acid. Such fluxing agents are obtained by first reacting an aliphatic hydrocarbon-substituted succinic acid or derivative thereof which is capable of forming carboximide bonds with an alkylene polyamine to form a carboximide and then reacting said carboximide with an alkylaryl sulfonic acid.

In preparing the first reaction product, the aliphatic hydrocarbon-substituted succinic acid will normally be used as an anhydride, although other acid derivatives which are capable of forming carboximide bonds may be employed. The reaction will be carried out so that least one imide is formed. The alkylene polyamine which is employed will have at least 2 carbon atoms and at least 2 nitrogen atoms, the nitrogen atoms being separated by at least 2 carbon atoms. Normally the alkylene polyamine will not be of more than 10 nitrogen atoms and not more than 30 carbon atoms.

The polyamine and succinic acid compounds are combined in a mol ratio of at least 0.1:1 to about 1.5:1, more usually from about 0.1:1 to about 1.2:1 The conditions of reaction are such that as imide formation is obtained, the water of reaction is removed. While mixtures are obtained, the reaction product will normally be an imide with other minor products also present such as amines, imidazolines, amine salts, etc. There will be at least one full equivalent of amine nitrogen in excess over the number of mols of succinic compound, and preferably at least 2 equivalents in excess. That is, at least one basic amine nitrogen will be present per molecule, so that the basic amine nitrogen is available to form a salt with the alkylaryl sulfonic acid.

The first reaction product and the alkylaryl sulfonic acid are then combined to form a salt. The most important consideration in determining the quantity of the first reaction product to be combined with the sulfonic acid is to be certain there are sufficient titratable amine nitrogens present in the first reaction product to react with all of the sulfuric acid present in the sulfonic acid. Typically, however, the quantity of the first reaction product used is more than the minimum. Generally, the alkylaryl sulfonic acid is employed in an amount of from 1 mol per mol of first reaction product up to about 2 mols of sulfonic acid per basic titratable amine nitrogen atom in the first reaction product.

The succinic compound, usually the succinic anhydride, will be combined with the polyamine at a temperature in the range of about 90°–275° C, more usually about 100°–200° C. The time for the reaction will generally be from about ½ hour to 24 hours, more usually in the range of about 1 to about 12 hours, and preferably in the range of about 3 to about 7 hours.

Conveniently the reactants may be combined in an inert reaction medium such as a hydrocarbon, e.g., mineral lubricating oil. The concentration of reactants may range from about 1 to about 90% weight, but usually will be from about 25 to about 75% weight of the total reaction mixture. Preferably the water formed during the reaction is removed either by distillation or, if convenient, subatmospheric pressures may be employed.

The sulfonic acid salt may then be prepared directly by adding the alkylaryl sulfonic acid either at room temperature or at elevated temperatures to the first reaction product to form the desired salt. The reaction may be carried out neat or in an inert medium such as that employed in preparing the first reaction product.

The wax-soluble product useful in the compositons of this invention, for the most part, will be comprised of a product of the formula

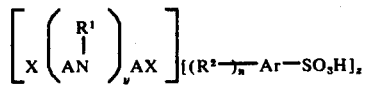

wherein X represents

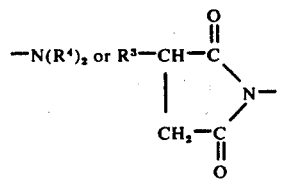

and wherein:

A. $R^1$ and $R^4$ each independently represent hydrogen or an alkyl containing from 1 to about 5 carbon atoms such as methyl, ethyl, propyl, isopropyl, butyl, isobutyl, sec-butyl, t-butyl, pentyl, amyl, t-amyl, and the like;

B. A is an alkylene radical containing from 2 to about 6 carbon atoms such as ethylene, propylene, trimethylene, tetramethylene, pentamethylene, hexamethylene, and the like;

C. $y$ is a number from 0 to 10;

D. such that when A represents ethylene, the $R^1$ groups on adjacent nitrogen atoms may be joined to form ethylene;

E. $R^3$ represents an alkyl or alkenyl radical of from about 20 to about 400 carbon atoms such as long-chain hydrocarbons or polymers and copolymers of low-molecular-weight olefins such as ethylene (copolymerized with olefin containing more than 2 carbon atoms), propylene, butylene, isobutylene, and the like;

F. Ar represents an aryl group such as phenylene, naphthalene, anthracenylene, and the like, preferably phenylene;

G. $R^2$ represents a wax-solubilizing group contaning 1 to about 22 carbon atoms, such as methyl, ethyl, propyl, butyl, isobutyl, t-butyl, pentyl, hexyl, octyl, tripropenyl, decyl, dodecyl, tetrapropenyl, tridecyl, tetradecyl, pentadecyl, pentapropenyl, hexadecyl, octadecyl, hexapropenyl, eicosyl, docosyl, and the like;

H. $n$ represents a positive integer of from 1 to 3;

I. such that the total number of carbon atoms contained in all of said $R^2$ groups is from about 8 to about 30 carbon atoms; and J. $z$ represents a number from 1 up to about twice the number of titratable amine nitrogens, preferably $z$ represents a number such that the ratio of $z$ to the number of titratable nitrogen atoms is from about 0.9 to about 2.1.

The above formula is intended to represent symbolically the number of atoms present in the molecule, but not to represent the actual structure of the molecule. Thus, the alkylene and alkylene piperazine components need not be present in any particular order but may be interspersed among one another. Similarly, the alkylaryl sulfonic acid portion of the molecule in the above formula is intended to include ionic structures.

The aliphatic radical substituent $R^3$ is readily obtained by polymerizing monoolefins of from 2 to 5 carbon atoms, such as ethylene (copolymerized with olefins containing more than 2 carbon atoms), propylene, n-butene, isobutylene, or pentene, or mixtures thereof. Methods of polymerization are well known in the art, as are methods of substituting the aliphatic chain onto the succinic anhydride structure.

The polyamine with which the aliphatic hydrocarbon-substituted succinic anhydride is reacted contains 2 to 30 carbon atoms, 1 to 10 nitrogen atoms, and preferably 1 to 6 nitrogen atoms as its only hetero atoms. It is free of unsaturation. The nitrogen atoms in the secondary amino groups are joined by alkylene or piperazine groups of from 2 to 6 carbon atoms and, more usually, of from 2 to 3 carbon atoms. These nitrogen atoms may be substituted with hydrogen or lower alkyl of 1 to 6 carbon atoms, preferably of from 1 to 3 carbon atoms.

The polyamine reactant preferably has the following formula:

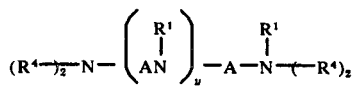

wherein A, $R^1$, $R^4$, and $y$ have the meanings set forth above, such that the $R^4$ groups on at least one of the terminal nitrogen atoms both represent hydrogen. Illustrative alkylene polyamines and polyalkylene polyamines of the foregoing types include ethylene diamine, diethylene triamine, triethylene tetraamine, tetraethylene pentamine, pentaethylene hexaamine, nonaethylene decamine, dipropylene diamine, dimethylamino propylamine, N-amino ethyl piperazine, and the like.

The hydrocarbon sulfonic acids have the general formula:

wherein $R^2$, Ar, and $n$ have the same meanings as set forth above. These sulfonic acids can be obtained from a variety of sources, both natural and synthetic. Sulfonic acids can be derived from petroleum products by treating such products with sulfuric acid or sulfur trioxide. The compounds in the petroleum product which become sulfonated contain a wax-solubilized group, as discussed above. The acids thus obtained are known as petroleum sulfonic acids. Also included are sulfonic acids of synthetic alkylaryl compounds. These acids are prepared by treating an alkylaryl compound with sulfuric acid or sulfur trioxide. At least one alkyl substituent of the aryl compound is a wax-solubilized group, as discussed above. The acids thus obtained are known as alkyl aryl sulfonic acids. These sulfonic acids wherein the alkyl is a straight-chain alkyl are the well-known linear alkyl sulfonic acids (LAS). A number of synthetic sulfonic acids are available. A particularly useful synthetic sulfonic acid is available under the name Cal Soft LAS 99, available from Pilot Chemical Company. This sulfonic acid is primarily a linear $C_{12}$ alkyl-benzene sulfonic acid. Another useful synthetic sulfonic acid is dodecyl benzene sulfonic acid, available from Chemithon Chemical Co.

Most of the commercially available sulfonic acids contain small amounts (generally less than 2% by weight) of free sulfuric acid remaining in the sulfonic acid from the sulfonation step. This sulfonic acid can cause a staining problem with phenolic circuit boards, as mentioned above. By combining the sulfonic acid with the succinimide, as provided in this invention, the succinimide not only chemically ties up the sulfuric acid in such a manner that it no longer stains the phenolic boards, but the succinimide also provides some additional fluxing action over and above that obtained with the sulfonic acid. In addition, the succinimide portion of the salt imparts dispersing properties to the composition, which helps disperse any impurities or sludge formed during manufacture or use throughout the composition.

In the preparation of the wax-soluble products mentioned above, if a solvent is used, it is generally removed after the reaction is complete so as to not impart any undesired properties to the wax-flux compositions prepared therefrom. Such undesirable properties would include fuming of the wax-flux composition when it is melted for application to the circuit board.

The Wax-Flux Compositions

The wax-flux compositions of this invention are prepared by melting the wax of wax blend and dissolving the succinimide salt therein. The mixture is then stirred until homogeneity is obtained. The wax-flux composition is cast into blocks or slabs and allowed to solidify unless it is to be immediately used.

The wax-flux compositions of this invention will contain an amount effective to cause fluxing, at or below the soldering temperature of the piece to be soldered, of the wax-soluble succinimide salt. This effective amount can readily be determined by those skilled in the art by a few simple soldering tests to determine the minimum amount necessary. Any amount above the minimum necessary to cause effective fluxing generally is not necessary and increases the cost of the wax-flux composition without additional benefits during the soldering process. Typically, the wax-flux compositions will contain from about 1 to about 20 weight percent of the succinimide salt, more usually from about 3 to about 12 weight percent and preferably from about 5 to about 10 weight percent.

The Process

The wax-flux compositions of this invention are useful in the soldering process of this invention. The soldering process for this invention provides a method for soldering electrical components to a printed circuit board. Printed circuit boards are well known in the art. They consist of a non-conducting substrate and a pattern of an electrically conductive metal laminated to the substrate. Typically, the substrate is a phenolic resin or an epoxy fiberglass composition board. Almost universally the electrically conductive metal is a copper foil. The pattern of the conductive metal on the substrate can be prepared by a number of means well known to those skilled in the art.

The printed cicuit board has lead receiving holes. The electrical component leads are inserted through the holes from the non-pattern side of the board. Typically, the electrical components have leads which extend 1 to 2 inches beyond the pattern side of the board. In some prior art method of soldering the components to the board, the leads are soldered to the metal pattern and then the lead is trimmed relatively close to the board.

The process of this invention is particularly applicable to automated soldering with wave soldering machines. Wave soldering machines are commercially available from a number of sources and are used by most of the electronics industry manufacturers. As mentioned above, a particularly troublesome problem in trying to solder electronic components to printed circuit boards with wave soldering machines is the long leads of the electronic components which extend beyond the board.

In the process of this invention, the component leads are inserted through the holes of the printed circuit board. Then without trimming the leads, the molten wax-flux composition is applied to the metal pattern side of the circuit board and allowed to solidify. Once the wax-flux composition has solidified, the components are firmly attached to the board and the component leads can be trimmed prior to the soldering operation.

The component leads of the waxed board can be trimmed by any available method including hand-trimming and automated trimming. A most convenient method of trimming uses a high-speed circular metal-cutting saw. One example of such a saw is a 16-inch high-speed circular saw sold by Hollis Engineering Compay of Nasha, New Hampshire under the name Holli-Cutter. To use the Holli-Cutter the printed circit board is placed on a conveyer which passes over the circular saw. The space between the printed circuit board and the saw blade is adjusted to give trimmed leads of the desired length.

After the leads are trimmed, the electrical components are soldered to the printed circuit board with a low-melting-point alloy solder. This soldering operation can be conducted by any of the conventionally available means such as by hand-soldering or by automated wave soldering.

In a preferred embodiment of the process, the wax-flux composition is applied to the printed circuit board by contacting the metal pattern side of the board with the crest of a standing wave of molten wax-flux composition. Thereafter the wax-flux composition is allowed to solidify, generally with the aid of a forced draft of cold air. The component leads are then trimmed by an automated cutting means which is placed in line with the conveyer carrying the printed circuit board. Thereafter the components are soldered to the board by contacting the metal pattern side of the board with the crest of a standing wave of the low-melting-point alloy solder, typically, in one of the commercially available automated wave soldering machines.

When a wave soldering machine is used, it is often found advantageous to maintain a thin film of tinning oil over the surface of the standing pool of molten solder in the catch basin of the wave soldering machine. The tinning oil helps reduce oxidation and dross formation of the molten solder which can lead to poor soldering. Suitable tinning oils are available commercially. One such tinning oil is available from Hollis Engineering Company and comprises a bright stock containing fats, fatty acids, naturally occurring unsaturated long-chain acids, and oxidation inhibitors.

Typically, the tinning oil is changed approximately every 8 hours In the process of this invention, the tinning oil becomes contaminated with the wax-flux composition which melts and is removed from the printed circuit board during the soldering operation. It has been found such a small quantity of wax-flux composition is coated onto each board, that even with a very high soldering rate, the wax-flux composition contamination of the tinning oil does not cause a significant reduction in the useful life of the oil. This slight increase in the frequency of changing the tinning oil is a very small price to pay for the convenience and improved soldering offered by the process of this invention.

Subsequent to the soldering process, any remaining traces of the flux are generally removed from the printed circuit board. This prevents potential long-term corrosion of the printed circuit board and the component leads.

The flux and tinning oil can be removed either by vapor degreasing or aqueous washing. Machines are available commercially for practicing both methods. For aqueous washing, these generally resemble large dishwashers. Typically, the wash water is maintained between 60° C and 72° C. Generally a detergent is used during the washing process. Typical detergents are mixtures of alkaline surface-active agents and nonionic surface active agents. Suitable commercially available detergents include Aqua-Clean available from Hollis Engineering Company and Lonco-Terge available from Lonco Corporation.

As a final step of the washing process the circuit boards are rinsed with warm or hot deionized or distilled water to remove the last traces of the fluxing agent and the detergents.

EXAMPLES

The following examples are included to further illustrate preparation of the succinimide salts of the alkylaryl sulfonic acids useful in the wax-flux compositions of this invention.

EXAMPLE 1

To a beaker is charged 31.8 g of a polyisobutenyl succinimide produced by reacting a polybutene (having a number average molecular weight of 950) substituted succinic anhydride with tetraethylene pentamine at an amine/anhydride mol ratio of 0.87 as a 44% weight solution in a neutral solvent-refined oil and 9.8 g of docecyl benzene sulfonic acid commercially available as Cal-Soft LAS 99 (sulfonic acid — minimum 97% weight, sulfuric acid — maximum 1.5% weight). The succinimide-to-sulfonic acid mol ratio is 1:3. The calculated molecular weight for the succinimide is determined by dividing the nitrogen content of the succinimide into 70, the sum of the atomic weight of the 5 nitrogen atoms present in the ideal succinimide molecule prepared from tetraethylene pentamine, which in this case yields a calculated molecular weight of 3300. The molecular weight of the sulfonic acid was taken as the theoretical molecular weight of 326 for dedecyl benzene sulfonic acid. This mixture is stirred at 137.5°–143.5° C. for 3 hours. The oil solution of the product is designated as I-A.

In a similar manner, 31.8 g of the same succinimide and 16.3 g of the same sulfonic acid are stirred at 137.5°–143.5° C for 3 hours. The succinimide-to-sulfonic acid mol ratio is 1:5. The oil solution of the product is designated as I-B.

In a similar manner, 31.8 g of the same succinimide and 22.8 g of the same sulfonic acid are stirred at 137.5°–143.5° C for 3 hours. The mol ratio of the succinimide to sulfonic acid is 1:7. The oil solution of the product obtained is designated as I-C.

In all of the above reactions, evolution of the heat of salt formation was observed.

EXAMPLE 2

Succinimide salts are prepared in a similar manner as that used in Example 1 above using the same succinimide but using a dodecyl benzene sulfonic acid available from Chemithon Chemical Company, having an analysis of 0.4% weight sulfuric acid, 8.1% weight of diluent oil and 90.5% weight of dodecyl benzene sulfonic acid.

In a first reaction at a succinimide-to-sulfonic acid mol ratio of 1:5, 31.8 g of the succinimide and 18 g of the sulfonic acid are stirred at 137.5°–143.5° C for 3 hours. Evolution of the heat of salt formation was observed. The oil solution of this product is designated as II-A.

In a similar manner, at a succinimide-to-sulfonic acid mol ratio of 1:7, 31.8 g of the same succinimide and 25.2 g of the sulfonic acid are heated with stirring for 3 hours. Evolution of the heat of salt formation was observed. The oil solution of this product is designated as II-B.

EXAMPLE 3

A bis-succinimide is prepared by reacting a polybutene (average molecular weight 950) substituted succinic anhydride with tetraethylene pentamine at an amine/anhydride mol ratio of 0.5. The bis-succinimide is used as an approximately 40% solution in a diluent oil.

In a beaker, 48.7 g of the bis-succinimide and 16.3 g of the Cal-Soft LAS 99 sulfonic acid are heated with stirring at 137.5°–143.5° C for 3 hours. The bis-succinimide/sulfonic acid mol ratio is 1:5. The oil solution of this product is designated at III-A.

In a similar manner, at a bis-succinimide-sulfonic acid mol ratio of 1:7, 48.7 g of the bis-succinimide and 22.8 g of the sulfonic acid are heated with stirring for 3 hours. The oil solution of this product is designated as III-B.

In a similar manner, at a bis-succinimide/sulfonic acid mol ratio of 1:3, 48.7 g of the bis-succinimide and 9.8 g of the sulfonic acid are heated with stirring for 3 hours. The oil solution of this product is designated as III-C.

Each of the above examples 1–3 is repeated with the only change in procedure being that the reaction mixture is heated with stirring at the indicated temperature for 5 hours rather than for 3 hours.

The following examples are included to further illustrate soldering with the wax-flux compositions of the invention.

Wax-flux compositions of this invention are tested in commercially available wave soldering equipment. The results of these tests are compared against soldering operations conducted in commercially available wave soldering equipment using a commercially available wave soldering flux, namely Alpha Reliafoam 809 Flux available from Alpha Metals, Inc., 56 Water Street, Jersey City, New Jersey 07304. This flux is one of the most widely used commercially available liquid fluxes for wave soldering. It has been found to have the capacity to satisfactorily flux copper printed circuit boards having visible dirt, tarnish and corrosion.

For soldering sample printed circuit boards using the commercially available Alpha flux, the wave soldering equipment comprises an in-line unit having a foam flux applicator, a preheater, and a wave solder applicator. The in-line unit includes a conveyer which transports the boards through the various steps of the soldering operation. Printed circuit boards for the soldering operation are prepared by inserting the leads of electronic components through the holes in the printed circuit board, trimming the leads, and bending the stubs over against the copper foil. The printed circuit boards used in these tests are deliberately prepared to be dirty, tarnished and difficult to solder.

For soldering printed circuit boards using the wax-flux composition of this invention the wave soldering equipment includes a wax-flux applicator in which the molten wax-flux composition at about 75°–95° C is pumped into a standing wave about 4–5 cm in height. Next in line is a lead trimmer which is, in this case, a Holli-Cutter available from Hollis Engineering, Inc. The Holli-Cutter comprises a 16-inch high-speed tungsten carbide-tipped circular saw. After the lead trimmer is the board preheater and then the wave solder applicator. The leads of electronic components are inserted through the holes in the printed circuit board. The leads are left untrimmed. The board with the electronic components is placed on the conveyor of the soldering apparatus. The printed circuit board is conveyed first over the wax-flux wave. A thin film of wax-flux remains on the underside of the printed circuit board. The board then passes over a forced draft of cool air which cools and solidifies the wax. The board then passes over the lead trimmer and the electronic component leads are trimmed to the desired length. The board then passes over the flux preheater and over the wave of solder. The printed circuit boards soldered with the wax-flux composition of this invention and according to the process of this invention are then compared with the printed circuit boards soldering using the commercially available liquid flux.

EXAMPLE 4

Each of the succinimide salts of the sulfonic acids prepared in Examples 1–3 above are blended with a refined base wax having an AMP of 154–156, such that the wax blend contains 10% weight of the oil solution of the product. Each of these wax-flux blends is tested on a Miniscograph and found to exhibit a satisfactory time to wet and total wetting of the copper coupon in a soldering operation.

EXAMPLE 5

A wax-flux composition comprising 90% weight refined base wax having an AMP of 154–156 and 10% weight of an oil solution of a succinimide salt of Cal-Soft LAS 99 is tested in a wave-soldering apparatus.

The succinimide salt is prepared by combining 12,000 g of a 44% weight solution of the succinimide used in Example 1 above with 6000 g of Cal-Soft LAS 99. This mixture was heated with stirring at 137°–138° C for 4 hours.

The wax-flux composition securely attaches the electronic components to the printed circuit board and allows fully satisfactory automated lead trimming. During the soldering step, this wax-flux composition provides fluxing and allows powdering comparable to the commercially available soldering flux.

Subsequent to the soldering step, the printed circuit board is washed in a circuit board washer using 71° C aqueous detergent solution containing Hollis Aqua-Clean. The washed boards are completely clean and free from any wax or oil residue.

What is claimed is:

1. A process for soldering an electrical component to a printed circuit board, said board comprising a non-conducting substrate and a pattern of an electrically conductive metal laminated to said substrate, said metal being solderable with a low-melting-point alloy solder, said board having component lead receiving holes through both said substrate and said metal pattern, said component having electrical leads, and said component being mounted on said board by having at least one of said leads inserted through a said lead receiving hole, said process comprising:
   a. applying a molten wax-flux composition to the metal pattern side of said board and to said component lead;
   b. allowing said wax-flux composition to solidify;
   c. trimming said component lead; and
   d. soldering said component to said printed circuit board with a low-melting-point alloy solder, wherein said wax-flux composition comprises:

I. a major amount of a wax having an AMP between 0° C and 100° C; and
II. an amount effective to cause fluxing, at or below the soldering temperature, of the piece to be soldered in said process of a wax-soluble product obtained by first reacting a $C_{20}$–$C_{400}$ aliphatic hydrocarbon-substituted succinic acid or a derivative thereof which is capable of forming carboximide bonds with a $C_2$–$C_{30}$, $N_2$–$N_{10}$ alkylene polyamine to form a carboximide and then reacting said carboximide with a ($C_8$–$C_{30}$ alkyl)aryl sulfonic acid.

2. The process of claim 1 wherein:
a. said wax-flux composition is applied to said board by contacting the metal pattern side of said board with the crest of a standing wave of said molten wax-flux composition; and
b. said component is soldered to said board by contacting the metal pattern side of said board with the crest of a standing wave of said low-melting-point alloy solder.

3. The process of claim 2 wherein said component lead is trimmed by a circular saw.

4. A process for soldering an electrical component to a printed circuit board, said board comprising a non-conducting substrate and a pattern of an electrically conductive metal laminated to said substrate, said metal being solderable with a low-melting-point alloy solder, said board having component lead receiving holes through both said substrate and said metal pattern, said component having electrical leads, and said component being mounted on said board by having at least one of said leads inserted through a said lead receiving hole, said process comprising:
a. applying a molten wax-flux composition to the metal pattern side of said board and to said component lead;
b. allowing said wax-flux composition to solidify;
c. trimming said component lead; and
d. soldering said component to said printed circuit board with a low-melting-point alloy solder, wherein said wax-flux composition comprises:
I. a major amount of a wax having an AMP between 0° C and 100° C; and
II. an amount effective to cause fluxing, at or below the soldering temperature, of the piece to be soldered in said process of a wax-soluble product of the formula

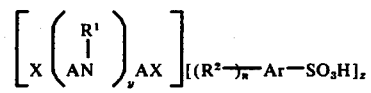

wherein X represents:

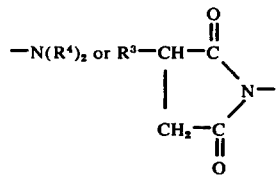

with at least one X being the latter radical; $R^1$ and $R^4$ each independently represent hydrogen or an alkyl containing from 1 to about 5 carbon atoms; A is an alkylene radical containing from 2 to about 6 carbon atoms; $y$ is a number from 0 to 10 such that when A represents ethylene $R^1$ on adjacent nitrogen atoms may be joined to form ethylene; $R^3$ represents an alkyl or alkenyl radical of from about 20 to about 400 carbon atoms; Ar represents an aryl group; $R^2$ represents a wax-solublizing group containing from 1 to about 22 carbon atoms; $n$ represents a positive integer of from 1 to 3 wherein the total number of carbon atoms contained in all of said $R^2$ groups is from 8 to about 80 carbon atoms; and $z$ represents a number from 1 up to the number of titratable amine nitrogens.

5. The process of claim 4 wherein:
a. said wax-flux composition is applied to said board by contacting the metal pattern side of said board with the crest of a standing wave of said wax-flux composition; and
b. said component is soldered to said board by contacting the metal pattern side of said board with the crest of a standing wave of said low-melting-point alloy solder.

6. The process of claim 5 wherein said component lead is trimmed by a circular saw.

* * * * *